United States Patent
Corrigan et al.

(10) Patent No.: US 10,705,119 B2
(45) Date of Patent: Jul. 7, 2020

(54) SHROUDED TEST PROBE

(71) Applicant: Fluke Corporation, Everett, WA (US)

(72) Inventors: Christopher D. Corrigan, Seattle, WA (US); Charles E. Marzette, Jr., Kirkland, WA (US); David J. Gibson, Everett, WA (US)

(73) Assignee: Fluke Corporation, Everett, WA (US)

( * ) Notice: Subject to any disclaimer, the term of this patent is extended or adjusted under 35 U.S.C. 154(b) by 200 days.

(21) Appl. No.: 15/901,600

(22) Filed: Feb. 21, 2018

(65) Prior Publication Data

US 2019/0257857 A1   Aug. 22, 2019

(51) Int. Cl.
*G01R 1/067* (2006.01)

(52) U.S. Cl.
CPC ..... *G01R 1/06788* (2013.01); *G01R 1/06777* (2013.01)

(58) Field of Classification Search
CPC ............ G01R 1/06788; G01R 1/06777; G01R 1/06772; G01R 27/2676; G01R 29/0878; G01R 1/06; G01R 1/067; G01R 1/06705
USPC .............. 324/72.5, 149, 690, 696, 715, 724, 324/755.01–755.05, 755.11
See application file for complete search history.

(56) References Cited

U.S. PATENT DOCUMENTS

| | | | | |
|---|---|---|---|---|
| 4,245,189 A | * | 1/1981 | Wahl | G01R 1/06788 324/716 |
| 4,423,373 A | * | 12/1983 | LeCroy, Jr. | G01R 1/06788 324/72.5 |
| 4,464,623 A | * | 8/1984 | Chambon | G01R 19/145 324/149 |
| 5,457,392 A | * | 10/1995 | Filipescu | G01R 1/06788 324/555 |
| 5,512,839 A | * | 4/1996 | De Monaco | G01R 1/06788 324/508 |
| 5,604,436 A | * | 2/1997 | Henritzy | G01R 31/44 324/133 |
| 5,789,911 A | * | 8/1998 | Brass | G01R 19/14 324/133 |
| 6,053,777 A | * | 4/2000 | Boyle | G01R 1/06722 439/700 |
| 6,437,556 B1 | * | 8/2002 | Sparks | G01R 1/06788 324/149 |

(Continued)

*Primary Examiner* — Patrick Assouad
*Assistant Examiner* — Sean Curtis
(74) *Attorney, Agent, or Firm* — Seed Intellectual Property Law Group LLP

(57) ABSTRACT

A test probe includes an electrically insulating handle, an electrically conducting blade extending from the handle, an electrically insulating shroud including a first portion and a second portion that are at least partially disposed around the electrically conducting blade. A housing is attached to the handle such that the first portion of the shroud is disposed within the housing, and the second portion of the shroud extends from an aperture formed in the housing. A spring disposed between the handle and the shroud biases the shroud toward the aperture formed in the housing. The shroud protects the electrically conducting blade from unintentional contact with a conductor during testing. When the test probe is correctly positioned on a device being tested, the shroud retracts into the housing exposing the electrically conducting blade. When the test probe is moved away from the device, the shroud returns to its original position.

20 Claims, 7 Drawing Sheets

(56) References Cited

U.S. PATENT DOCUMENTS

| | | | | |
|---|---|---|---|---|
| 6,603,302 B2* | 8/2003 | Prineppi | G01R 31/50 324/133 |
| 6,756,799 B1* | 6/2004 | Seltzer | G01R 15/12 324/149 |
| 6,957,005 B2* | 10/2005 | Saulnier | G01R 1/06722 324/750.23 |
| 7,017,435 B2* | 3/2006 | Pooley | G01D 11/245 73/866.5 |
| 7,102,370 B2* | 9/2006 | Cannon | G01R 1/06788 324/754.02 |
| 7,148,712 B1* | 12/2006 | Prey, Jr. | G01R 1/06788 324/754.07 |
| 7,167,011 B2* | 1/2007 | Yang | G01R 1/06788 324/754.07 |
| 7,456,642 B2* | 11/2008 | Saulnier | G01R 1/06788 324/755.05 |
| 7,671,613 B1* | 3/2010 | Campbell | G01R 1/06788 324/754.11 |
| 7,880,487 B2* | 2/2011 | Petrick | G01R 1/06788 324/754.07 |
| 7,902,848 B2* | 3/2011 | Eccleston | G01R 1/06788 324/754.01 |
| 8,098,078 B1* | 1/2012 | Campbell | G01R 1/06788 324/754.11 |
| 8,152,213 B2* | 4/2012 | Fortune | B25B 9/02 294/99.2 |
| 9,140,724 B1* | 9/2015 | Campbell | G01R 1/06788 |
| 9,274,144 B2* | 3/2016 | Chait | G01R 1/06788 |
| 9,529,014 B1* | 12/2016 | Minneman | G01R 1/06788 |
| 9,618,535 B2* | 4/2017 | Chait | G01R 1/06788 |
| 10,041,977 B2* | 8/2018 | Kasai | G01R 1/06788 |
| 10,267,829 B2* | 4/2019 | Kasai | G01R 19/0084 |
| 2004/0267109 A1* | 12/2004 | Dancel | G01R 1/06788 600/407 |
| 2005/0262953 A1* | 12/2005 | Pooley | G01D 11/245 73/866.5 |
| 2006/0061348 A1* | 3/2006 | Cannon | G01R 1/06788 324/72.5 |
| 2006/0267608 A1* | 11/2006 | Faust | G01R 1/06711 324/755.01 |
| 2007/0241740 A1* | 10/2007 | Hawes | G01R 1/04 324/149 |
| 2007/0262784 A1* | 11/2007 | Leon | G01R 1/06722 324/755.05 |
| 2016/0223587 A1* | 8/2016 | Swaim | G01R 3/00 |
| 2017/0340891 A1* | 11/2017 | Boggs | A61N 1/0558 |
| 2018/0104481 A1* | 4/2018 | Boggs | A61N 1/37205 |
| 2019/0060642 A1* | 2/2019 | Boggs, II | A61N 1/0502 |
| 2019/0257857 A1* | 8/2019 | Corrigan | G01R 1/06777 |

\* cited by examiner

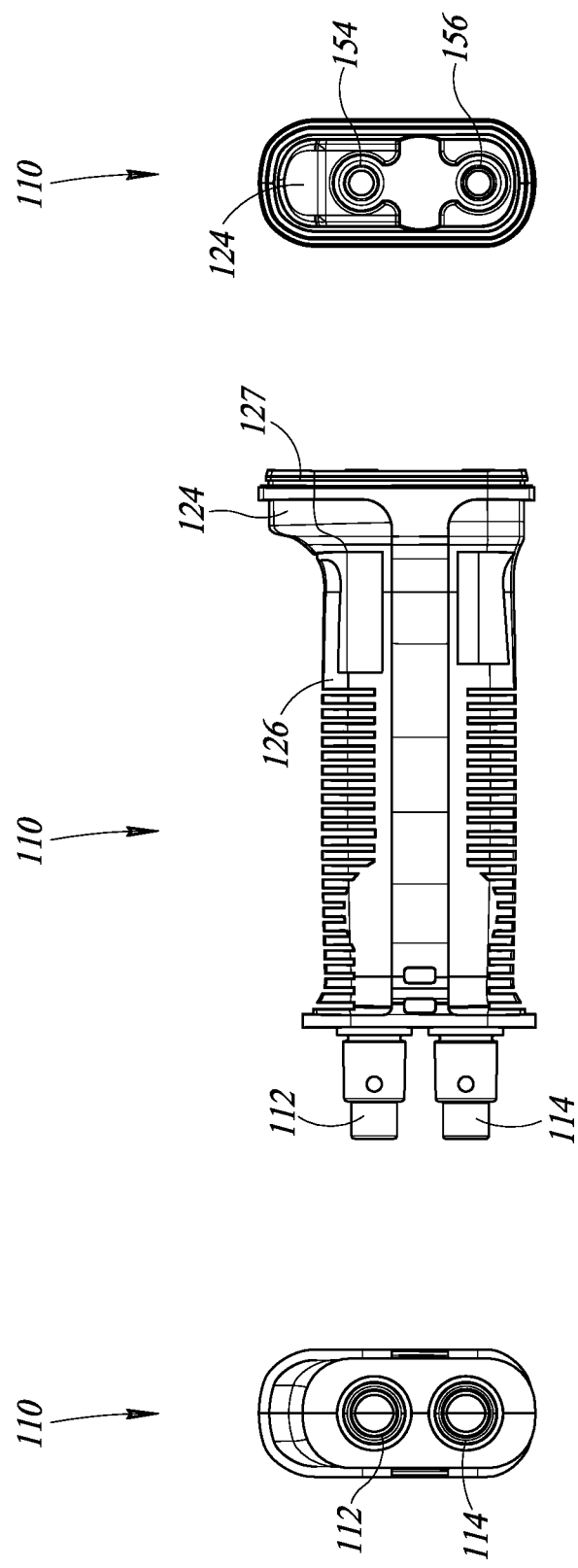

SHROUDED TEST PROBE

BACKGROUND

Technical Field

The present disclosure relates generally to test probe devices, and more specifically to test probes having conductive probe tips that contact electrical conductors of devices under test and have retractable shrouds disposed around the probe tips.

Description of the Related Art

Test probes have been used to connect electronic test equipment to devices in order for the test equipment to take measurements used to test the operation of those devices. For example, test probes have been used to connect electronic test equipment to perform three-phase electric current and voltage testing of electrical meters at customer premises to ensure that the meters are wired correctly and are accurately measuring the amount of electricity used by customers. The test probes have exposed tips that are attached to electrical connectors that are coupled to test switches, which are coupled to the meters. Such exposed tips can create a safety hazard to an operator performing a test if the operator accidentally causes the probe tip to contact a conductor that is at a high voltage potential, for example.

BRIEF SUMMARY

Accordingly, it is desirable to provide a test probe having a probe tip and a shroud made of an electrically insulating material that at least partially covers the probe tip and retracts when an operator has correctly placed the probe tip on an electrical connector that is being used to perform testing.

A test probe may be summarized as including: an electrically insulating handle; at least one electrically conducting blade extending from the handle; an electrically insulating shroud including a first portion and a second portion that are at least partially disposed around the at least one electrically conducting blade; a housing attached to the handle, the first portion of the shroud being disposed within the housing, and the second portion of the shroud extending from an aperture formed in the housing; and at least one spring disposed between the handle and the shroud, the at least one spring biasing the shroud toward the aperture formed in the housing.

The second portion of the shroud may have an annular end surface partially disposed around the at least one electrically conducting blade. The first portion of the shroud may have at least one aperture formed therein, and the at least one spring may be at least partially disposed within the at least one aperture formed in the first portion of the shroud. The handle may include an electrically insulating base portion having a recess extending into the base portion at a first end thereof. At least one projection that extends from the base portion may be disposed within the recess, the at least one projection may have an aperture formed therein, and the at least one spring may be partially disposed within the aperture formed in the at least one projection. The first portion of the shroud may have at least one aperture formed therein, and the at least one spring may be at least partially disposed within the at least one aperture formed in the first portion of the shroud. The base portion may include at least one mounting portion that extends from a second end of the base portion, the second end being opposite the first end, and the test probe may further include at least one wire strain relief portion coupled to the at least one mounting portion. The at least one electrically conducting blade may include a first blade and a second blade, the first blade may include a planar portion having a sloped surface that tapers toward the second blade, and the second blade may include a planar portion having a sloped surface that tapers toward the first blade. The at least one spring may include a first spring and a second spring, and the at least one electrically conducting blade may be disposed between the first spring and the second spring.

A test probe may be summarized as including: an electrically insulating handle; a first electrically conducting blade extending from the handle; a second electrically conducting blade extending from the handle; an electrically insulating material disposed between the first blade and the second blade; an electrically insulating shroud including a first portion and a second portion that are at least partially disposed around the first electrically conducting blade, the second electrically conducting blade, and the electrically insulating material; a housing attached to the handle, the first portion of the shroud being disposed within the housing, and the second portion of the shroud extending from an aperture formed in the housing; a first spring disposed between the handle and the shroud; and a second spring disposed between the handle and the shroud, the first spring and the second spring biasing the shroud toward the aperture formed in the housing.

The first electrically conducting blade, the second electrically conducting blade, and the electrically insulating material may be disposed between the first spring and the second spring. The first electrically conducting blade may include a first planar portion and a second planar portion that extends from the first planar portion, the first planar portion of the first electrically conducting blade being perpendicular to the second planar portion of the first electrically conducting blade, and the second electrically conducting blade may include a first planar portion and a second planar portion that extends from the first planar portion, the first planar portion of the second electrically conducting blade being perpendicular to the second planar portion of the second electrically conducting blade. The second portion of the shroud may include a plurality of projections, each of the projections extending inwardly from an interior surface of the second portion of the shroud. The second portion of the shroud may have an annular end surface partially disposed around the first electrically conducting blade, the second electrically conducting blade, and the electrically insulating material. The first electrically conducting blade may include a sloped surface disposed at one end of the first electrically conducting blade, the second electrically conducting blade may include a sloped surface disposed at one end of the second electrically conducting blade, and the second portion of the shroud may have an annular end surface partially disposed around the sloped surface of the first electrically conducting blade and the sloped surface of the second electrically conducting blade. The first portion of the shroud may have a first aperture and a second aperture formed therein, the first spring may be at least partially disposed within the first aperture formed in the first portion of the shroud, and the second spring may be at least partially disposed within the second aperture formed in the first portion of the shroud. The handle may include an electrically insulating base portion having a recess extending into the base portion at a first end thereof. A first projection and a second projection that extend from the base portion may be disposed within the recess, the first spring may be partially disposed within an aperture formed in the first projection, and the second spring may be partially disposed within an aperture formed in the second projection. The first portion of the shroud may have a first aperture and a second aperture formed therein, the first spring may be at least partially disposed within the first aperture formed in the first portion of the shroud, and the second spring may be at least partially disposed within the second aperture formed in the first portion of the shroud. The base portion may include a first mounting portion and a second mounting portion that extend from a second end of the base portion, the second end being opposite the first end, and the test probe may further include a first wire strain relief portion coupled to the first mounting portion and a second wire strain relief portion coupled to the second mounting portion.

BRIEF DESCRIPTION OF THE SEVERAL VIEWS OF THE DRAWINGS

FIGS. 3A, 3B, and 3C are rear, side, and front views, respectively, of a handle base portion, according to one or more embodiments of the present disclosure.

DETAILED DESCRIPTION

Figure 1:
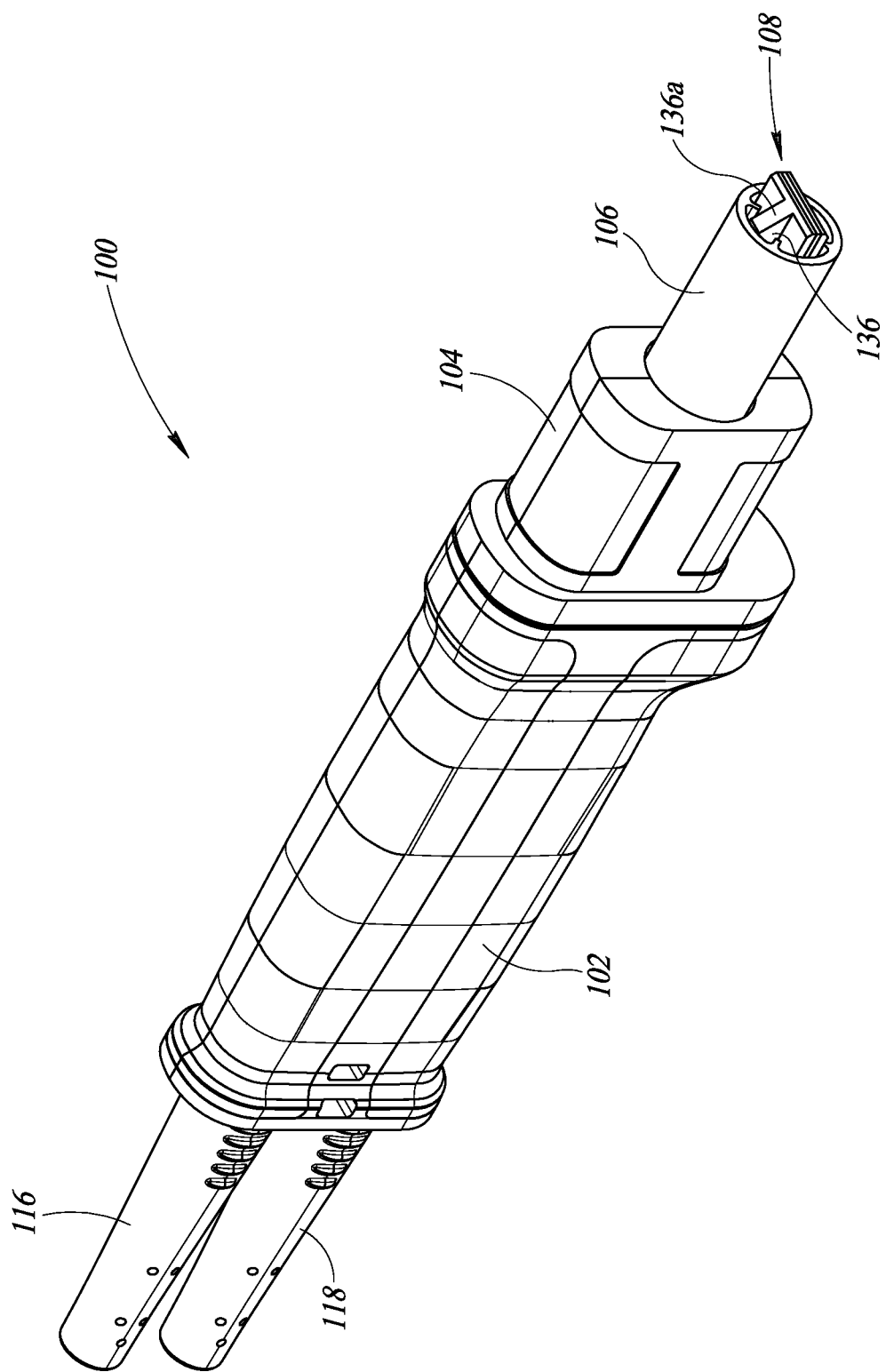
FIG. 1 is a side perspective view of a test probe, according to one or more embodiments of the present disclosure.

FIG. 1 is a side perspective view of a test probe 100, according to one or more embodiments of the present disclosure. As shown in FIG. 1, the test probe 100 includes a handle 102, a housing 104, a shroud 106, and probe lead 108. An operator grasps the handle 102 to position the test probe 100. As will be described in detail below, when the operator places the tip of the probe lead 108 on an electrical connector and pushes the handle 102 toward the electrical connector, the shroud 106 retracts into the housing 104 thereby exposing a portion of the probe lead 108 that then makes contact with the electrical connector.

Figure 2:
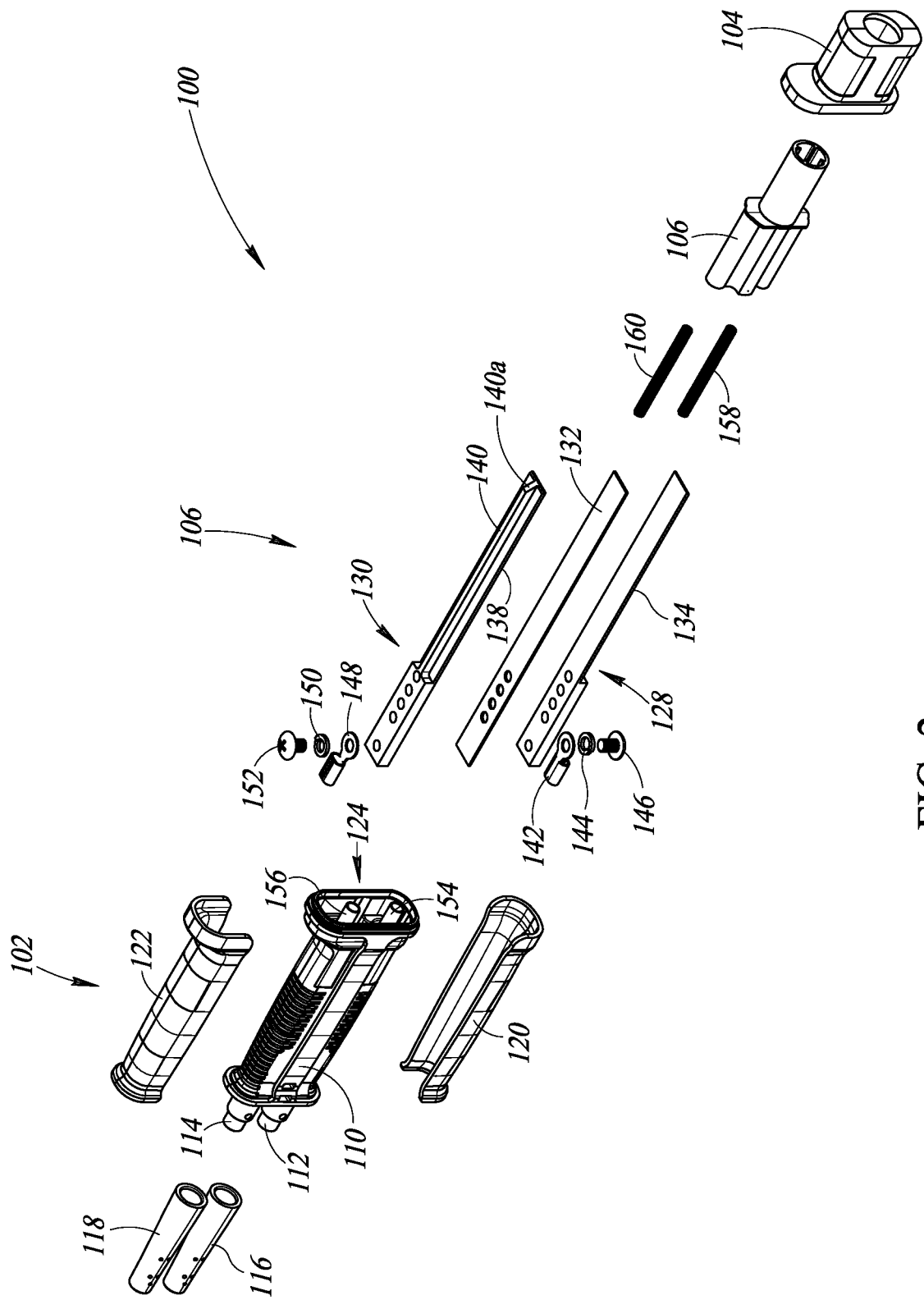
FIG. 2 is an exploded, side view of a test probe, according to one or more embodiments of the present disclosure.

FIG. 2 is an exploded, side view of a test probe 100, according to one or more embodiments of the present disclosure. As shown in FIG. 2, the handle 102 includes a base portion 110. FIGS. 3A, 3B, and 3C are rear, side, and front views, respectively, of a base portion 110, according to one or more embodiments of the present disclosure.

In one or more embodiments, the base portion 110 is formed using a molding process from a polycarbonate (PC) and acrylonitrile butadiene styrene (ABS) blend that is flame retardant. The base portion 110 includes a first mounting portion 112 and a second mounting portion 114 that extend from a proximal end thereof. The first mounting portion 112 and the second mounting portion 114 each have a first cylindrical projection and a second cylindrical projection, which have different outer diameters. As will be explained below, the first mounting portion 112 and the second mounting portion 114 are used to attach a first wire strain relief portion 116 and a second wire strain relief portion 118 to the base portion 110, respectively. A first cover 120 and a second cover 122 are attached using a suitable adhesive material to a central part of the base portion 110 where an operator grasps the handle 102. In one or more embodiments, the first wire strain relief portion 116, the second wire strain relief portion 118, the first cover portion 120, and the second cover portion 122 are formed using a molding process from a thermoplastic elastomer (TPE), for example, Sarlink® 4175 which is available from the Teknor Apex Company.

As shown in FIG. 3B, the base portion 110 includes a recessed portion 124 at a distal end thereof, and a mounting portion 126 adjacent to the recessed portion 124. A flange 127 extends outwardly from an outer wall of the base portion 110. When the test probe 100 is assembled, the probe lead 108 extends from the recessed portion 124 of the base portion 110 of the handle 102. As shown in FIG. 2, the probe lead 108 is comprised of a first blade 128, a second blade 130, and a separator 132 that is disposed between the first blade 128 and the second blade 130 and electrically isolates the blades 128, 130 from each other. In one or more embodiments, the first blade 128 and the second blade 130 are formed from brass, and the separator 132 is a board formed from FR-4, which is a composite material composed of woven fiberglass cloth with an epoxy resin binder that is flame resistant. The first blade 128 and the second blade 130 are attached to the separator 132 using a suitable adhesive material.

In one or more embodiments, the first blade 128 and the second blade 130 each have a so-called duckbill configuration. More particularly, the first blade 128 includes a first planar portion 134 that extends along the separator 132 and a second planar portion 136 (see FIG. 1) that is perpendicular to the first planar portion 134 and has a sloped surface 136a at a distal end thereof that tapers toward the first planar portion 134 and the second blade 130. Similarly, the second blade 130 includes a first planar portion 138 (see FIG. 2) that extends along the separator 132 and a second planar portion 140 that is perpendicular to the first planar portion 138 and has a sloped surface 140a at a distal end thereof that tapers toward the first planar portion 138 and the first blade 128.

When the probe lead 108 is assembled, a proximal end of the probe lead 108 is passed through an aperture formed in the bottom of the recessed portion 124 and the mounting portion 126. In one or more embodiments, the probe lead 108 is attached to the mounting portion 126 using a suitable adhesive material. Then, a first wire (not shown) and a second wire (not shown) are attached the first blade 128 and the second blade 130, respectively. More particularly, a first end of the first wire is attached to a first ring lug 142 using a wire crimping tool, and then the first ring lug 142 is attached to the first blade 128 using a first lock washer 144 and a first bolt 146 that is rotated to advance the first bolt 146 into a threaded aperture formed in the first blade 128. A second end of the first wire is threaded through apertures formed in the first mounting portion 112 and the first wire strain relief portion 116, and the first wire strain relief portion 116 is attached to the first mounting portion 112, for example, using a suitable adhesive material. Similarly, a first end of the second wire is attached to a second ring lug 148 using a wire crimping tool, and then the second ring lug 148 is attached to the second blade 130 using a second lock washer 150 and a second bolt 152 that is rotated to advance the second bolt 152 into a threaded aperture formed in the second blade 130. A second end of the second wire is threaded through apertures formed in the second mounting portion 114 and the second wire strain relief portion 118, and the second wire strain relief portion 118 is attached to the second mounting portion 114, for example, using a suitable adhesive material. The second ends of the first wire and the second wires are attached, for example, by soldering to a first electrical connector (not shown) which is configured to connect or mate with to a second electrical connector (not shown) of an electrical testing device (not shown).

Attachment of the shroud 106 to the handle 102 will now be described. As shown in FIGS. 2 and 3C, a first cylindrical projection 154 and a second cylindrical projection 156 extend from a bottom surface of the recessed portion 124 of the base portion 110 of the handle 102. The first cylindrical projection 154 has an aperture formed therein with an inner diameter that is slightly larger than an outer diameter of a first spring 158, and the second cylindrical projection 156 has an aperture formed therein with an inner diameter that is slightly larger than an outer diameter of a second spring 160. In one or more embodiments, the first spring 158 and the second spring 160 are substantially identical and are torsion springs formed from nickel plated brass. The first spring 158 is placed in the aperture of the first cylindrical projection 154, and the second spring 160 is placed in the aperture of the second cylindrical projection 156.

Figure 4C:
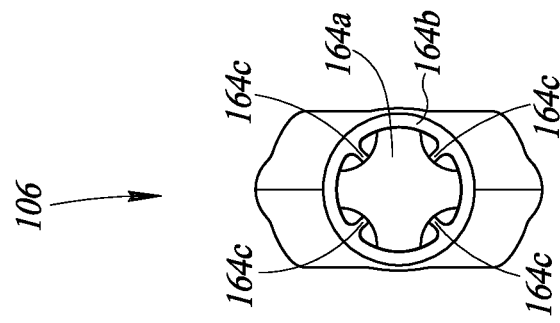
FIGS. 4A, 4B, and 4C are rear, side, and front views, respectively, of a probe tip shroud, according to one or more embodiments of the present disclosure.
Figure 4B:
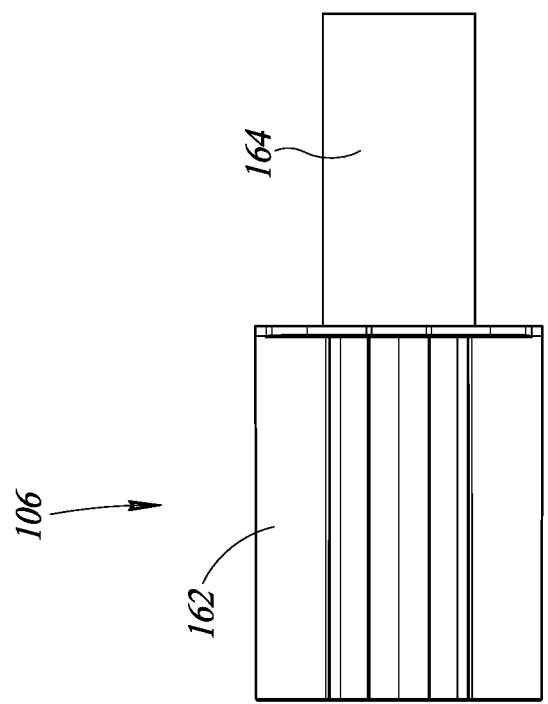
Figure 4A:
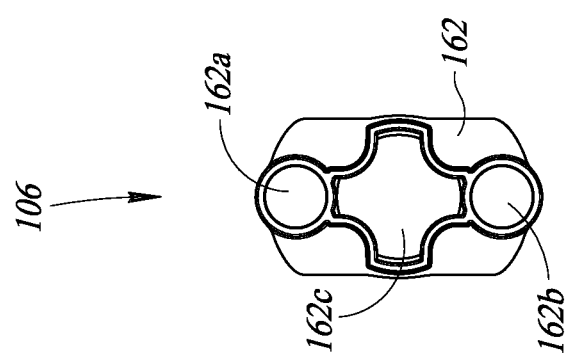

FIGS. 4A, 4B, and 4C are rear, side, and front views, respectively, of a shroud 106, according to one or more embodiments of the present disclosure. As shown in FIG. 4B, the shroud 106 includes a first portion 162 and a second portion 164 that extends from the first portion 162. As shown in FIG. 4A, the first portion 162 includes a first aperture 162a, a second aperture 162b, and a third aperture 162c that is disposed between the first aperture 162a and the second aperture 162b. The first aperture 162a is cylindrical and has a diameter that is slightly larger than the outer diameter of the first spring 158, and the second aperture 162b is cylindrical and has an inner diameter that is slightly larger than the outer diameter of the second spring 160. The third aperture 162c has a shape that enables the probe lead 108 to freely pass therethrough. The second portion 164 is cylindrical and has an aperture 164a formed therein with an inner diameter that enables the probe lead 108 to pass therethrough. As shown in FIG. 4C, the second portion 164 includes an annular end surface 164b at a distal end thereof, which prevents part of the sheath 106 from entering a portion of a device under test. In addition, the second portion 164 includes four projections 164c, wherein each projection 164c extends radially inwardly from an interior surface of the second portion 164.

When the test probe 100 is assembled, one of the projections 164c is disposed between the first planar portion 134 and the second planar portion 136 of the first blade 128 on a first side of the second planar portion 136, and another one of the projections 164c is disposed between the first planar portion 134 and the second planar portion 136 of the first blade 128 on a second side of the second planar portion 136. Similarly, one of the projections 164c is disposed between the first planar portion 138 and the second planar portion 140 of the second blade 130 on a first side of the second planar portion 140, and another one of the projections 164c is disposed between the first planar portion 138 and the second planar portion 140 of the second blade 130 on a second side of the second planar portion 140. The projections 164c ensure that the second portion 164 of the shroud 106 fits closely around the lead portion 108 and does not permit dirt, for example, from entering the second portion 164 of the shroud 106. Also, when the test probe 100 is assembled, the probe lead 108 is disposed between the first spring 158 and the second spring 160.

The handle 102 with the probe lead 108 extending from the recessed portion 124 is arranged such that the first spring 158 does not fall out of the first cylindrical projection 154 and the second spring 160 does not fall out of the second cylindrical projection 156. The shroud 106 is then positioned adjacent to the handle 102 and moved toward the handle 102 such that part of the first spring 158 is disposed within the first aperture 162a, part of the second spring 160 is disposed within the second aperture 162b, part of the probe lead 108 is disposed within the third aperture 162c, and another part of the probe lead 108 is disposed within the aperture 164a of the second portion 164 of the shroud 106.

Figure 5C:
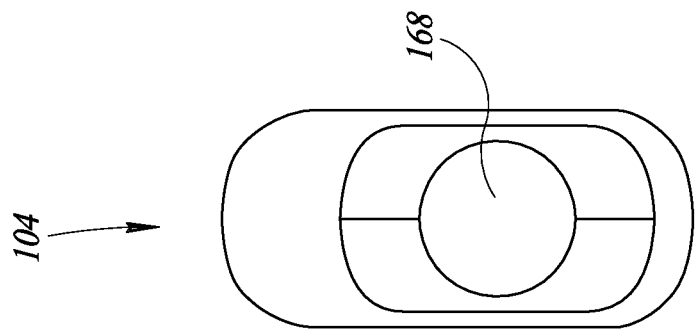
FIGS. 5A, 5B, and 5C are rear, side, and front views, respectively, of a housing, according to one or more embodiments of the present disclosure.
Figure 5B:
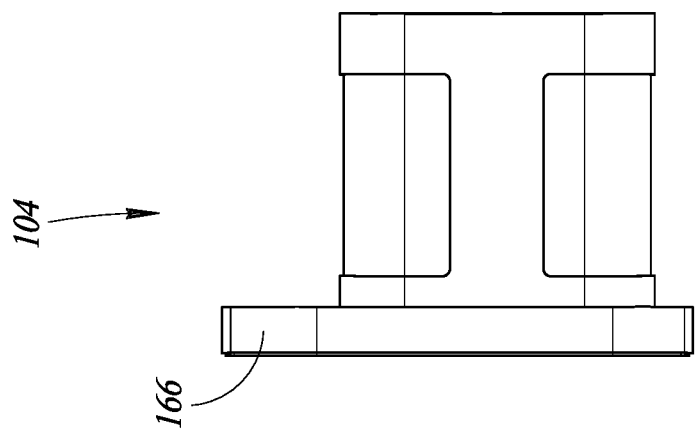
Figure 5A:
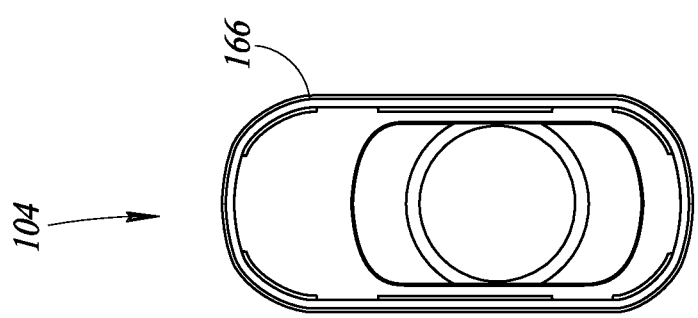

The shroud 106 is then secured to the handle 102 using the housing 104, as described below. FIG. 5A is rear view of the housing 104, FIG. 5B is a side view of the housing 104, and FIG. 5C is a front view of the housing 104, according to one or more embodiments of the present disclosure. As shown in FIGS. 5A and 5B, a lip 166 is formed at a proximal end of the housing 104. An aperture 168 is formed in the housing 104. An inner diameter of the aperture 168 is smaller than an outer diameter of the first portion 162 of the shroud 106, which prevents the first portion 162 of the shroud 106 from passing through the aperture 168. The inner diameter of the aperture 168 is smaller than an outer diameter of the second portion 164 of the shroud 106, which enables the second portion 164 of the shroud 106 to move freely through the aperture 168.

The proximal end of the housing 104 is placed adjacent to the partially assembled test probe 100 and moved toward the handle 102 such that the second portion 164 passes through the aperture 168 until the lip 166 of the housing 104 contacts the flange 127 of the base portion 110 of the handle 102. A suitable amount of pressure is applied to the housing 104 to cause the lip 166 of the housing 104 to snap fit around the flange 127 thereby securing the housing 104, and thus the shroud 106, to the handle 102. Additionally or alternatively, a suitable adhesive material may be used to secure the housing 104 to the handle 102. In one or more embodiments, when the test probe 100 is not being used, the second portion 164 of the shroud 106 leaves a small amount (e.g., less than 4 mm) of the test lead 108 exposed.

Figure 6A:
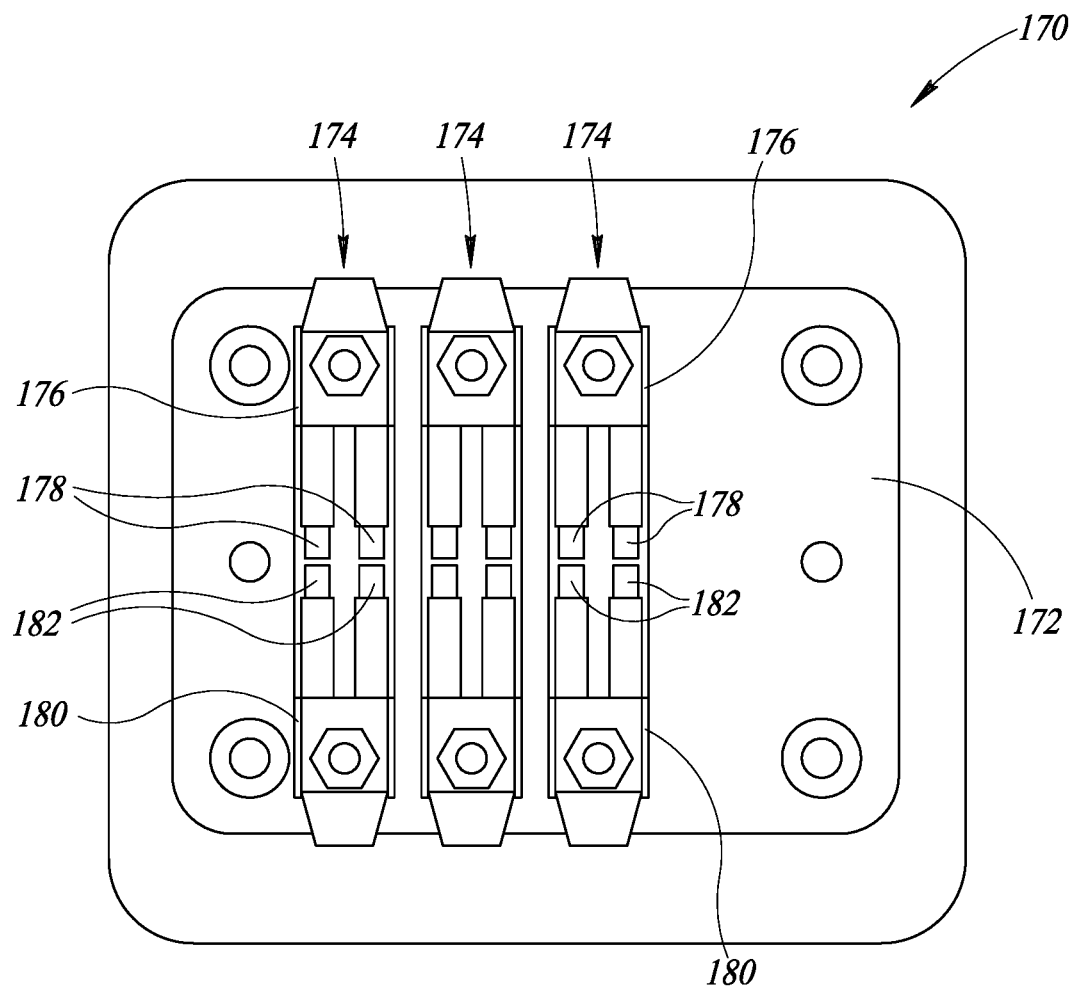
FIG. 6A is a front view of a test switch terminal that can be tested using a test probe, according to one or more embodiments of the present disclosure.

Having described the structure of the test probe 100, use of the test probe 100 will now be described with reference to FIGS. 6A, 6B, and 6C. FIG. 6A shows a test switch terminal 170 that includes a base plate 172 and a plurality of electrical connectors 174, each of which is identically configured in FIG. 6A. Each electrical connector 174 includes a first portion 176 that is mounted to the base plate 172, wherein the first portion 176 includes a pair of prongs 178. In addition, each electrical connector 174 includes a second portion 180 that is mounted to the base plate 172, wherein the second portion 180 includes a pair of prongs 182. The electrical connectors 174 are formed from a conductive material, from example, brass. In the configuration shown in FIG. 6A, the first portion 176 and the second portion 180 of each of the electrical connectors 174 are electrically isolated from one another. The first portion 176 of each of the electrical connectors 174 is electrically coupled by a wire (not shown) to one phase of a three-phase voltage and current is supplied by a utility meter (not shown). The second portion 180 of each of the electrical connectors 174 is electrically coupled by a wire (not shown) to one phase of an electrical assembly (not shown) at a customer's premises.

Prior to performing a test, the first and second wires that are attached to the first blade 128 and the second blade 130 of the test probe 100 are attached to an electrical testing device, for example, a PowerMaster 3 Series Hand-held 3-Phase Meter Site Tester from Powermetrix located in Knoxville, Tenn. After the testing device is placed in an appropriate measurement mode, an operator grasps the handle 102 and positions the test probe 100 such that the probe lead 108 is adjacent to the prongs 178 and 182 of one of the electrical connectors 174.

Figure 6B:
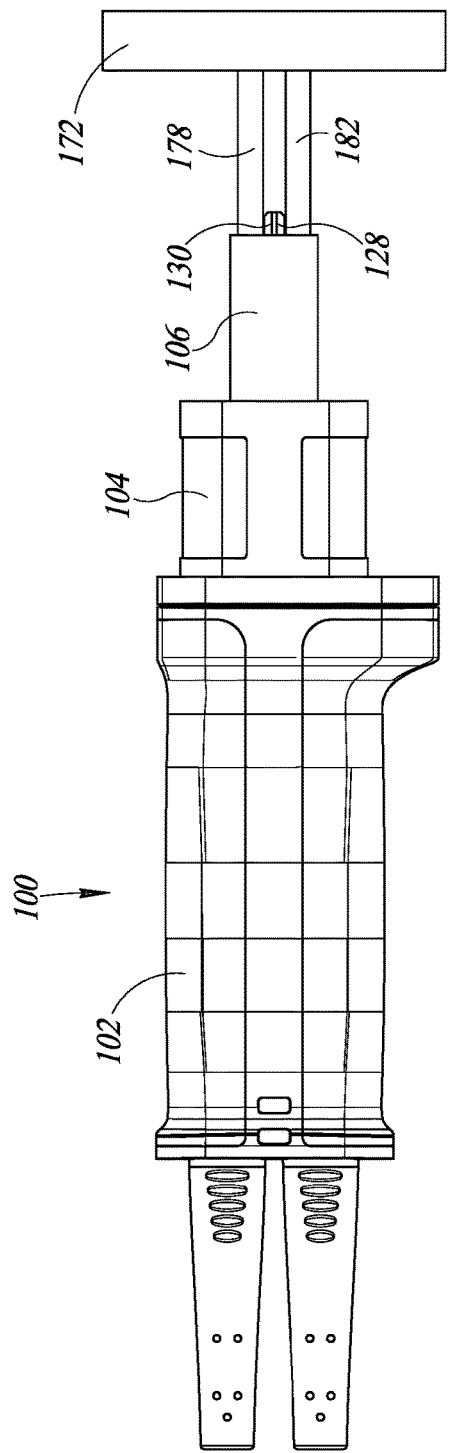
FIGS. 6B and 6C are side views of a portion of the test switch terminal shown in FIG. 6A with a test probe, according to one or more embodiments of the present disclosure.
Figure 6C:
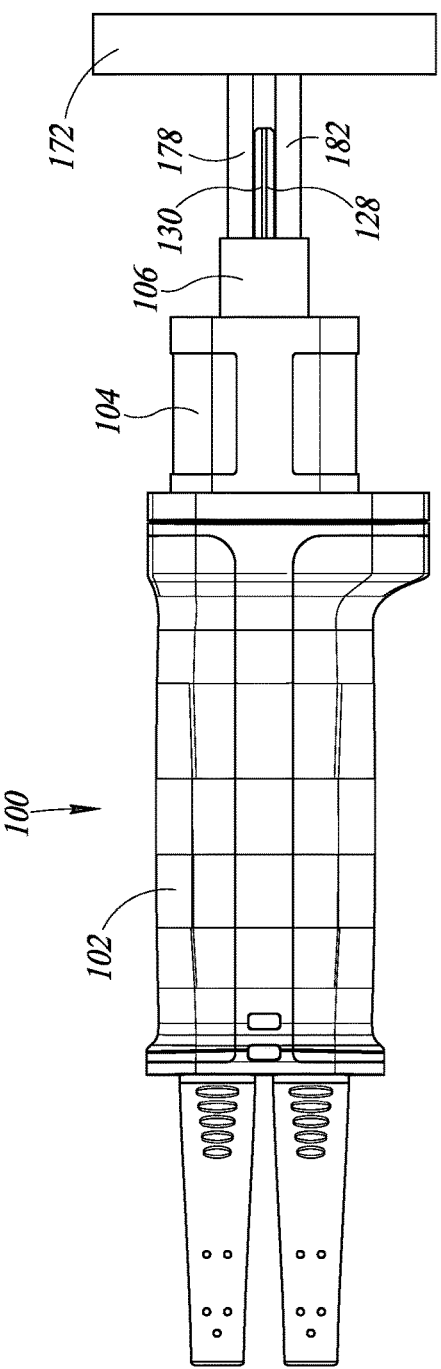

FIGS. 6B and 6C are side views of a portion of the test switch terminal 170, which are used to describe the operation of the test probe 100, according to one or more embodiments of the present disclosure. Some portions of the test switch terminal 170 are not shown in FIGS. 6B and 6C for illustrative simplicity. FIG. 6B shows an example of the test probe 100 positioned as described above adjacent to the prongs 178 and 182 of one of the electrical connectors 174. After the test probe 100 is positioned as shown in FIG. 6B, the operator uses the handle 102 to move the test probe 100 toward the prongs 178 and 182 of the electrical connector 174. As the operator moves the test probe 100 toward the prongs 178 and 182, the prongs 178 and 182 exert a force on the end surface 164b of the second portion 164 of the shroud 106 that causes the shroud 106 to compress the first spring 158 and second spring 160, which enables part of the second portion 164 of the shroud 106 move or retract into the housing 104, thereby exposing more of the first blade 128 and the second blade 130.

The exposed portion of the first blade 128 contacts the prongs 182, and the exposed portion of the second blade 130 contacts the prongs 178. When the test probe 100 is positioned as shown in FIG. 6C, a current flows from the meter to the test device via the first blade 128 and the first wire attached thereto, which enables the test device to measure predetermined characteristics of the current. In addition, a current flows from the test device to the electrical assembly at the customer's premises via the second blade 130 and the second wire attached thereto.

After the test device has completed taking measurements, the operator pulls on the handle 102 and moves the test probe 100 away from the test switch terminal 170. After the test probe 100 is moved away from the test switch terminal 170, the compressed first spring 158 and second spring 160 exert a force on the shroud 106, which causes the causes the part of the second portion 164 of the shroud 106 that was previously retracted into the housing 104 to return to its original position covering most of the first blade 128 and the second blade 130.

Because the shroud 106 is formed from an insulating material, if the operator accidentally touches the covered portions of the first blade 128 and the second blade 130 to a conductor that is at a high voltage potential, the operator and test device are protected from having a potentially dangerous current flowing therethrough. The operator is provided with additional protection because the various components of the handle 102 are formed from an insulating material, and there are no conductors that extend from within the test probe 100 to an exterior portion of the handle 102.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A test probe comprising: an electrically insulating handle; at least one electrically conducting blade extending from the handle; an electrically insulating shroud including a first portion and a second portion that are at least partially disposed around the at least one electrically conducting blade; a housing attached to the handle, the first portion of the shroud being disposed within the housing, and the second portion of the shroud extending from an aperture formed in the housing; and at least one spring disposed between the handle and the shroud, the at least one spring biasing the shroud toward the aperture formed in the housing, wherein: the handle includes an electrically insulating base portion having a recess extending into the base portion at a first end thereof, at least one projection that extends from the base portion is disposed within the recess, the at least one projection has an aperture formed therein, and the at least one spring is partially disposed within the aperture formed in the at least one projection.

2. The test probe of claim 1 wherein the second portion of the shroud has an annular end surface partially disposed around the at least one electrically conducting blade.

3. The test probe of claim 1 wherein the first portion of the shroud has at least one aperture formed therein, and the at least one spring is at least partially disposed within the at least one aperture formed in the first portion of the shroud.

4. The test probe of claim 1 wherein the first portion of the shroud has at least one aperture formed therein, and the at least one spring is at least partially disposed within the at least one aperture formed in the first portion of the shroud.

5. The test probe of claim 1 wherein the base portion includes at least one mounting portion that extends from a second end of the base portion, the second end being opposite the first end, and the test probe further includes at least one wire strain relief portion coupled to the at least one mounting portion.

6. The test probe of claim 1 wherein: the at least one electrically conducting blade includes a first blade and a second blade, the first blade includes a planar portion having a sloped surface that tapers toward the second blade, and the second blade includes a planar portion having a sloped surface that tapers toward the first blade.

7. The test probe of claim 1 wherein the at least one spring includes a first spring and a second spring, and the at least one electrically conducting blade is disposed between the first spring and the second spring.

8. A test probe comprising: an electrically insulating handle; a first electrically conducting blade extending from the handle; a second electrically conducting blade extending from the handle; an electrically insulating material disposed between the first blade and the second blade; an electrically insulating shroud including a first portion and a second portion that are at least partially disposed around the first electrically conducting blade, the second electrically conducting blade, and the electrically insulating material; a housing attached to the handle, the first portion of the shroud being disposed within the housing, and the second portion of the shroud extending from an aperture formed in the housing; a first spring disposed between the handle and the shroud; and a second spring disposed between the handle and the shroud, the first spring and the second spring biasing the shroud toward the aperture formed in the housing, wherein the second portion of the shroud includes a plurality of projections, each of the projections extending inwardly from an interior surface of the second portion of the shroud.

9. The test probe of claim 8 wherein the first electrically conducting blade, the second electrically conducting blade, and the electrically insulating material are disposed between the first spring and the second spring.

10. The test probe of claim 8 wherein: the first electrically conducting blade includes a first planar portion and a second planar portion that extends from the first planar portion, the first planar portion of the first electrically conducting blade being perpendicular to the second planar portion of the first electrically conducting blade, and the second electrically conducting blade includes a first planar portion and a second planar portion that extends from the first planar portion, the first planar portion of the second electrically conducting blade being perpendicular to the second planar portion of the second electrically conducting blade.

11. The test probe of claim 8 wherein the second portion of the shroud has an annular end surface partially disposed around the first electrically conducting blade, the second electrically conducting blade, and the electrically insulating material.

12. The test probe of claim 8 wherein: the first electrically conducting blade includes a sloped surface disposed at one end of the first electrically conducting blade, the second electrically conducting blade includes a sloped surface disposed at one end of the second electrically conducting blade, and the second portion of the shroud has an annular end surface partially disposed around the sloped surface of the first electrically conducting blade and the sloped surface of the second electrically conducting blade.

13. The test probe of claim 8 wherein: the first portion of the shroud has a first aperture and a second aperture formed therein, the first spring is at least partially disposed within the first aperture formed in the first portion of the shroud, and the second spring is at least partially disposed within the second aperture formed in the first portion of the shroud.

14. A test probe comprising: an electrically insulating handle, a first electrically conducting blade extending from the handle; a second electrically conducting blade extending from the handle; an electrically insulating material disposed between the first blade and the second blade, an electrically insulating shroud including a first portion and a second portion that are at least partially disposed around the first electrically conducting blade, the second electrically conducting blade, and the electrically insulating material; a housing attached to the handle, the first portion of the shroud being disposed within the housing, and the second portion of the shroud extending from an aperture formed in the housing; a first spring disposed between the handle and the shroud; and a second spring disposed between the handle and the shroud, the first spring and the second spring biasing the shroud toward the aperture formed in the housing, wherein: the handle includes an electrically insulating base portion having a recess extending into the base portion at a first end thereof, a first projection and a second projection that extend from the base portion are disposed within the recess, the first spring is partially disposed within an aperture formed in the first projection, and the second spring is partially disposed within an aperture formed in the second projection.

15. The test probe of claim 14 wherein: the first portion of the shroud has a first aperture and a second aperture formed therein, the first spring is at least partially disposed within the first aperture formed in the first portion of the shroud, and the second spring is at least partially disposed within the second aperture formed in the first portion of the shroud.

16. The test probe of claim 14 wherein the base portion includes a first mounting portion and a second mounting portion that extend from a second end of the base portion, the second end being opposite the first end, and the test probe further includes a first wire strain relief portion coupled to the first mounting portion and a second wire strain relief portion coupled to the second mounting portion.

17. The test probe of claim 14 wherein the second portion of the shroud includes a plurality of projections, each of the projections extending inwardly from an interior surface of the second portion of the shroud.

18. The test probe of claim 8 wherein: the handle includes an electrically insulating base portion having a recess extending into the base portion at a first end thereof, a first projection and a second projection that extend from the base portion are disposed within the recess, each of the first projection and the second projection has an aperture formed therein, the first spring is partially disposed within the aperture formed in the first projection, and the second spring is partially disposed within the aperture formed in the second projection.

19. The test probe of claim 18 wherein: the first portion of the shroud has a first aperture and a second aperture formed therein, the first spring is at least partially disposed within the first aperture formed in the first portion of the shroud, and the second spring is at least partially disposed within the second aperture formed in the first portion of the shroud.

20. The test probe of claim 1 wherein the second portion of the shroud includes a plurality of projections, each of the projections extending inwardly from an interior surface of the second portion of the shroud.

* * * * *